(12) United States Patent
Kim et al.

(10) Patent No.: US 8,400,779 B2
(45) Date of Patent: Mar. 19, 2013

(54) SEMICONDUCTOR PACKAGE HAVING MULTI PITCH BALL LAND

(75) Inventors: Tong-Suk Kim, Hwaseong-si (KR);
Heung-Kyu Kwon, Seongnam-si (KR);
Jeong-Oh Ha, Hwaseong-si (KR);
Hyun-A Kim, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 182 days.

(21) Appl. No.: 12/769,830

(22) Filed: Apr. 29, 2010

(65) Prior Publication Data

US 2011/0116247 A1    May 19, 2011

(30) Foreign Application Priority Data

Nov. 19, 2009   (KR) .................. 10-2009-0112254

(51) Int. Cl.
*H05K 7/00* (2006.01)
*H01L 23/48* (2006.01)

(52) U.S. Cl. ... 361/783; 361/760; 257/786; 257/E23.02; 257/E23.069; 257/E23.07

(58) Field of Classification Search .................. None
See application file for complete search history.

(56) References Cited

U.S. PATENT DOCUMENTS

| 5,847,936 | A | * | 12/1998 | Forehand et al. | 361/794 |
| 5,963,430 | A | * | 10/1999 | Londa | 361/790 |
| 6,194,668 | B1 | * | 2/2001 | Horiuchi et al. | 174/261 |
| 6,285,560 | B1 | * | 9/2001 | Lyne | 361/760 |
| 6,781,241 | B2 | * | 8/2004 | Nishimura et al. | 257/777 |
| 6,884,711 | B2 | * | 4/2005 | Vonstaudt | 438/617 |
| 7,122,904 | B2 | * | 10/2006 | Tsai et al. | 257/778 |
| 7,327,021 | B2 | | 2/2008 | Satou et al. | |
| 7,652,361 | B1 | * | 1/2010 | Yoshida et al. | 257/686 |
| 7,795,743 | B2 | * | 9/2010 | Kim et al. | 257/786 |
| 7,964,952 | B2 | * | 6/2011 | Lee | 257/686 |
| 2010/0314739 | A1 | * | 12/2010 | Kaufmann et al. | 257/686 |

FOREIGN PATENT DOCUMENTS

| JP | 06-045474 | 2/1994 |
| JP | 2004-047758 | 2/2004 |
| JP | 2006-173387 | 6/2006 |
| KR | 20060069229 | 6/2006 |

* cited by examiner

*Primary Examiner* — Boris Chervinsky
(74) *Attorney, Agent, or Firm* — Stanzione & Kim, LLP

(57) ABSTRACT

A semiconductor device having a printed circuit board and a semiconductor chip. The printed circuit board includes a chip region, a plurality of first ball lands adjacent to the chip region, and at least one second ball land adjacent to the first ball lands. The semiconductor chip is mounted on the chip region. The first ball lands are arranged to have a first pitch. One of the first ball lands which is nearest to the second ball land, and the second ball land have a second pitch greater than the first pitch.

27 Claims, 4 Drawing Sheets

SEMICONDUCTOR PACKAGE HAVING MULTI PITCH BALL LAND

CROSS-REFERENCE TO RELATED APPLICATIONS

This application claims priority under 35 U.S.C. §119 from Korean Patent Application No. 10-2009-112254, filed on Nov. 19, 2009, the contents of which are hereby incorporated herein by reference in its entirety.

BACKGROUND

1. Field of the Invention

Example embodiments of the present general inventive concept relate to a semiconductor device, and more specifically, to a printed circuit board having multi pitch ball lands and a semiconductor package having the same.

2. Description of the Related Art

To meet demands for light, thin, short, small and highly integrated semiconductor devices, package-on-package (POP) technology is being variously researched. Chips having various sizes have been developed, and shrunken versions thereof are being released in a short period of time. In order to respond to such circumstances, the POP technology faces various limitations.

SUMMARY

Example embodiments of the present general inventive concept provide a semiconductor package to which chips having a plurality of sizes are applicable.

Additional features and utilities of the present general inventive concept will be set forth in part in the description which follows and, in part, will be obvious from the description, or may be learned by practice of the general inventive concept.

Example embodiments of the present general inventive concept may provide a semiconductor device that includes a first printed circuit board and a first semiconductor chip. The first printed circuit board can include a chip region, a plurality of first ball lands adjacent to the chip region, and at least one second ball land adjacent to the first ball lands. The first semiconductor chip can be mounted on the chip region. The first ball lands can be arranged to have a first pitch. One of the plurality of first ball lands which is nearest to the second ball land and the second ball land can have a second pitch greater than the first pitch.

The second pitch may be up to twice as great as the first pitch or smaller.

The chip region may include first, second, third and fourth boundaries. The first boundary may be parallel to the third boundary, and the second boundary may be parallel to the fourth boundary. The first ball lands may be arranged parallel to the adjacent one of the first to fourth boundaries. The first ball lands may be arranged in a straight line, and the second ball land may be arranged on an extension line of the straight line. The second ball land may be arranged adjacent to intersections of the first to fourth boundaries.

An epoxy molding compound (EMC) covering the chip region and having at least one protrusion may be provided. The protrusion may be formed between the second ball land and the first ball lands. The protrusion may be arranged at the center between the second ball land and the first ball lands. A mold flash formed around the protrusion may be provided.

Example embodiments of the present general inventive concept may also provide a second semiconductor chip provided on the first printed circuit board. Conductive patterns may be formed between the second semiconductor chip and the first and second ball lands. The second semiconductor chip may be electrically connected to the first and second ball lands via the conductive patterns. A second printed circuit board may be provided between the second semiconductor chip and the conductive patterns. The second printed circuit board may include other ball lands corresponding to the first and second ball lands. The conductive patterns may be formed of one selected from the group consisting of a solder ball, a conductive bump, a conductive spacer and a combination thereof.

Example embodiments of the present general inventive concept may also provide a printed circuit board (PCB) that includes a chip region, a plurality of first ball lands adjacent to the chip region, and at least one second ball land adjacent to the first ball lands. The first ball lands may be arranged to have a first pitch, and one of the first ball lands which is nearest to the second ball land, and the second ball land have a second pitch. The second pitch may be twice as great as the first pitch or smaller.

Example embodiments of the present general inventive concept also provide an electronic system that includes a mainboard, an input/output device formed on the mainboard, and at least one semiconductor package formed on the mainboard and electrically connected to the input/output device. The semiconductor package can include a printed circuit board and a semiconductor chip. The printed circuit board has a first chip region, a plurality of first ball lands adjacent to the chip region, and at least one second ball land adjacent to the first ball lands. The semiconductor chip can be mounted on the chip region. The first ball lands are arranged to have a first pitch. One of the first ball lands which is nearest to the second ball land and the second ball land have a second pitch which is greater than the first pitch and is up to twice as great as the first pitch.

Exemplary embodiments of the present general inventive concept also provide a semiconductor package, including a first printed circuit board including a chip region to mount a semiconductor chip defined by at least a first boundary and a second boundary, a plurality of first ball lands disposed outside the chip region, and at least one second ball land disposed adjacent to the intersection of the first boundary and the second boundary, where the plurality of first ball lands are arranged to have a first pitch, and where the second ball land and one of the plurality of first ball lands which is nearest to the second ball land have a second pitch that is greater than the first pitch.

The semiconductor package may include where the chip region is further defined by a third boundary and a fourth boundary, with the first and third boundaries parallel with one another, and the second and fourth boundaries parallel with one another.

The semiconductor package may include where the plurality of the first ball lands are arranged parallel to at least one of the first, second, third, and fourth boundaries outside the chip region.

The semiconductor package may include where at least another second ball land is disposed adjacent to at least one of the intersection of the second and third boundaries, the third and fourth boundaries, and the first and fourth boundaries.

The semiconductor package may include an epoxy molding compound (EMC) covering at least a portion of the chip region and having at least one protrusion, where the protrusion is formed between the second ball land and the first ball lands.

The semiconductor package may include where the protrusion is arranged between the second ball land and the first ball lands.

The semiconductor package may include a mold flash formed around at least a portion of the protrusion.

The semiconductor package may include a second chip region provided on the first printed circuit board, and conductive patterns formed between the second chip region and the first and second ball lands, where the second chip region is electrically connected to the first and second ball lands via the conductive patterns.

The semiconductor package may include a second printed circuit board provided between the second chip region and the conductive patterns, where the second printed circuit board includes other ball lands corresponding to the first and second ball lands.

Exemplary embodiments of the present general inventive concept may also provide an electronic system, including a mainboard, an interface formed on the mainboard to transmit and receive signals, and at least one semiconductor package formed on the mainboard and electrically connected to the interface, where the semiconductor package includes a first printed circuit board including a chip region to mount a semiconductor chip defined by at least a first boundary and a second boundary, a plurality of first ball lands disposed outside the chip region, and at least one second ball land disposed adjacent to the intersection of the first boundary and the second boundary, where the plurality of first ball lands are arranged to have a first pitch, and where the second ball land and one of the plurality of first ball lands which is nearest to the second ball land have a second pitch that is greater than the first pitch.

The electronic system may include where the chip region is further defined by a third boundary and a fourth boundary, with the first and third boundaries parallel with one another, and the second and fourth boundaries parallel with one another.

The electronic system may include where the plurality of the first ball lands are arranged parallel to at least one of the first, second, third, and fourth boundaries outside the chip region.

The electronic system may include where at least another second ball land is disposed adjacent to at least one of the intersection of the second and third boundaries, the third and fourth boundaries, and the first and fourth boundaries.

BRIEF DESCRIPTION OF THE DRAWINGS

Example embodiments of the present general inventive concept are described in further detail below with reference to the accompanying drawings. It should be understood that various features of the drawings may have been exaggerated for clarity. The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
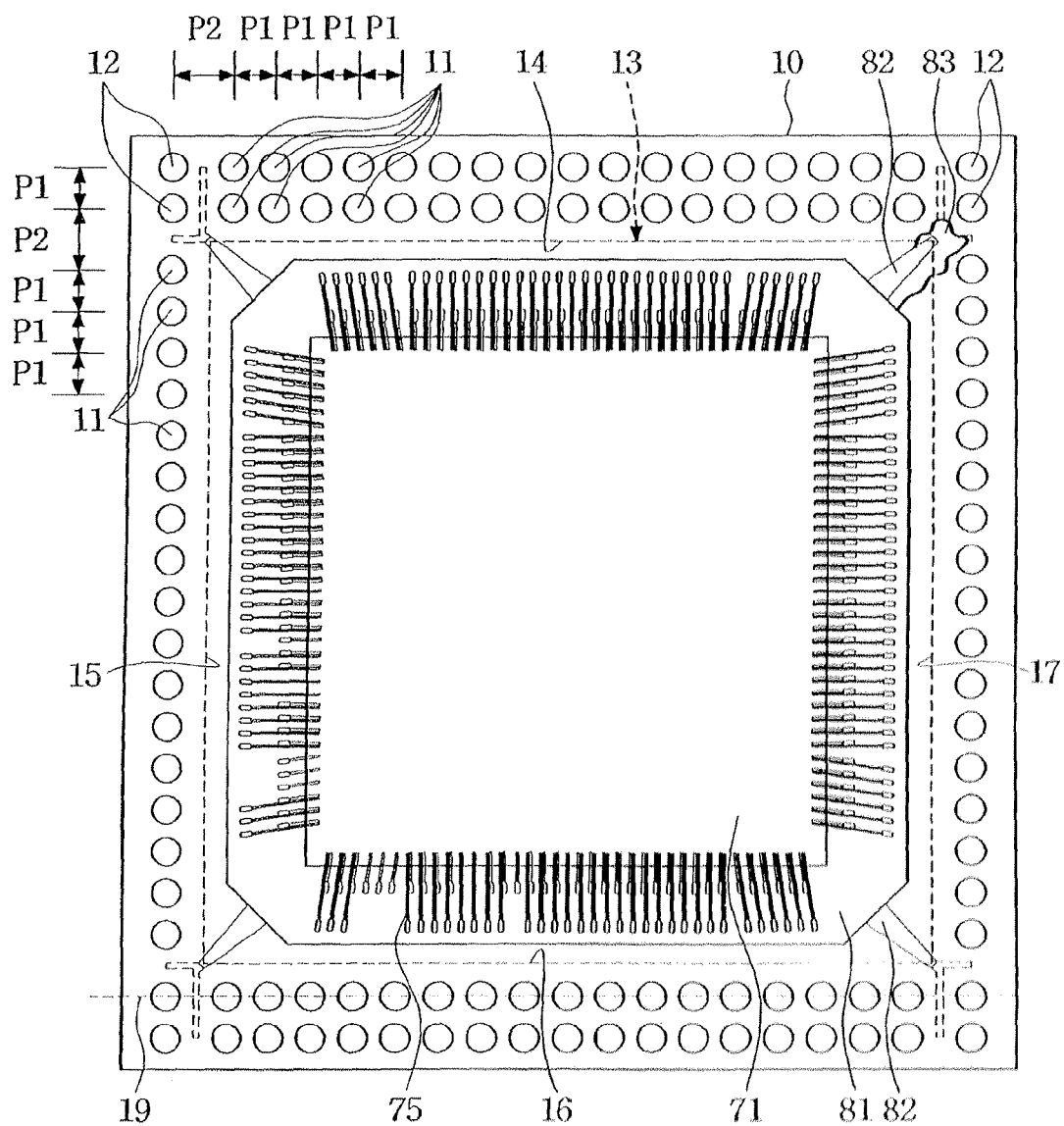
FIG. 1 illustrates a plan view of a semiconductor device according to example embodiments of the present general inventive concept.

Various example embodiments will now be described more fully with reference to the accompanying drawings in which some example embodiments are illustrated. This present general inventive concept may, however, be embodied in different forms and should not be construed as limited to the embodiments set forth herein. Rather, these embodiments are provided so that this disclosure is thorough and complete and fully conveys the scope of the present general inventive concept to one skilled in the art. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 illustrates a plan view of a semiconductor device according to example embodiments of the present general inventive concept.

Referring to FIG. 1, a semiconductor device according to the example embodiments of the present general inventive concept may include a printed circuit board (PCB) 10, and a semiconductor chip 71 mounted on the PCB 10.

The PCB 10 may be a flexible PCB, a rigid PCB, or a combination thereof. The PCB 10 may include a chip region 13, first ball lands 11, and second ball lands 12.

The chip region 13 may be provided on a surface of the PCB 10. The chip region 13 may be defined by first, second, third and fourth boundaries (e.g., first boundary 14, second boundary 15, third boundary 16, and fourth boundary 17). The first boundary 14 and the third boundary 16 may be parallel to each other, and the second boundary 15 and the fourth boundary 17 may be parallel to each other. The first and second boundaries 14 and 15 may be perpendicular to each other, and the third and fourth boundaries 16 and 17 may be perpendicular to each other.

The first ball lands 11 may be arranged parallel to the adjacent one of the first boundary 14, second boundary 15, third boundary 16, and fourth boundary 17. For example, one or more of the first ball lands 11 may be arranged on a place adjacent to the first boundary 14 at predetermined (e.g., regular) intervals along two rows parallel to the first boundary 14. Further, one or more of the first ball lands 11 may be arranged on a place adjacent to the second boundary 15 along a column parallel to the second boundary 15 at predetermined (e.g., regular) intervals. The first ball lands 11 may be arranged to have a first pitch P1. The first pitch P1 may be determined by, for example, a predetermined design rule, chip size (e.g., size of semiconductor chip 71), predetermined manufacturing tolerances, and any other suitable predetermined information to carry out the exemplary embodiments of the present general inventive concept disclosed herein. The first pitch P1 may be a standard pitch such as a 0.4 mm, 0.5 mm, 0.65 mm, 0.8 mm or 1.0 mm, or may be any other suitable pitch so as to carry out the exemplary embodiments of the present general inventive concept disclosed herein. For example, the first pitch P1 may be 0.65 mm.

The second ball lands 12 may be arranged adjacent to intersections of extension lines of the first to fourth boundaries 14, 15, 16 and 17. That is, the second ball lands 12 may be arranged adjacent to corners of the chip region 13. For example, one or more of the second ball lands 12 may be arranged adjacent to an intersection of extension lines of the first boundary 14 and the second boundary 15. As illustrated in FIG. 1, one or more of the first ball lands 11 may be arranged in a straight line 19 parallel to the third boundary 16 of a place adjacent to the third boundary 16 to have the first pitch P1. One or more of the second ball lands 12 may be disposed on an extension line of the straight line 19. One of the first ball lands 11 which is nearest to the second ball lands 12, and one of the second ball lands 12 which is nearest to the first ball lands 11 may be arranged to have a second pitch P2. For example, the second pitch P2 may be greater than the first pitch P1, and may be up to twice as great as the first pitch P1. For example, the second pitch P2 may be 0.75 mm or any other suitable pitch in order to carry out the exemplary embodiments of the present general inventive concept as disclosed herein.

The semiconductor chip 71 may be mounted on the chip region 13 of the PCB 10. The semiconductor chip 71 may include a volatile memory, a non-volatile memory, a logic device, a microprocessor, an application specific integrated circuit (ASIC), a programmable memory device, or a field programmable gate array (FPGA), or a combination thereof. The PCB 10 may be a multilayer board such as, for example, a four-layered, six-layered or eight-layered board, or may have any other suitable number of layers to carry out the exemplary embodiments of the present general inventive concept, and may include internal interconnections (not illustrated) such as bond fingers (not illustrated). The semiconductor chip 71 may be electrically connected to the bond fingers through connection interconnections 75. The connection interconnections 75 may be formed of an Au wire, an Al wire, a beam lead, a conductive tape, or a combination thereof, or may be any other connection to carry out the exemplary embodiments of the present general inventive concept. The first ball lands 11 and the second ball lands 12 may include a Cu layer, a W layer, a WN layer, a Ti layer, a TiN layer, a Ta layer, a TaN layer, a Au layer, an Al layer, a Ag layer, a Pt layer, a Pd layer, a Sn layer or a combination thereof. Accordingly, the semiconductor chip 71 may be electrically connected to the first ball lands 11 and the second ball lands 12 through the connection interconnections 75 and the internal interconnections.

According to example embodiments of the present general inventive concept, a distance between the second ball lands 12 and the first ball lands 11 can have the second pitch P2 be greater than the first pitch P1. That is, the distance between the second ball lands 12 and the first ball lands 11 may be adjustable such that the second pitch P2 is greater than the first pitch P1. To meet demands for a plurality of sizes of the semiconductor chip 71, the size of the PCB 10 may be adjusted so as to be equal to or greater than the sizes of the semiconductor chip 71. For example, a package corresponding to be greater than or equal to a predetermined size of the semiconductor chip 71 can be implemented according to exemplary embodiments of the present general inventive concept.

An epoxy molding compound (EMC) 81 covering the chip region 13 and having at least one protrusion 82 may be provided. The EMC 81 may cover the semiconductor chip 71 and the connection interconnections 75. The EMC 81 may protect the semiconductor chip 71 and the connection interconnections 75 from physical and/or chemical damage. That is, the EMC 81 may minimize chemical and/or physical damage to the semiconductor chip 71 and the connection interconnections 75. The protrusion 82 may be formed along an air vent of a mold die. The protrusion 82 may be formed adjacent to the intersections of the first to fourth boundaries 14, 15, 16 and 17. The protrusion 82 may be formed between the second ball lands 12 and the first ball lands 11. Furthermore, the protrusion 82 may be arranged at a center of a distance between the second ball lands 12 and the first ball lands 11. A mold flash 83 may be formed around the protrusion 82. The mold flash 83 may be formed between the second ball lands 12 and the first ball lands 11.

According to example embodiments of the present general inventive concept, a distance between the second ball lands 12 and the first ball lands 11 can have the second pitch P2 greater than the first pitch P1. That is, the distance between the second ball lands 12 and the first ball lands 11 is increased compared to a conventional art. Accordingly, an invasion failure of the mold flash 83 onto the first ball lands 11 or the second ball lands 12 may be minimized.

Figure 2:
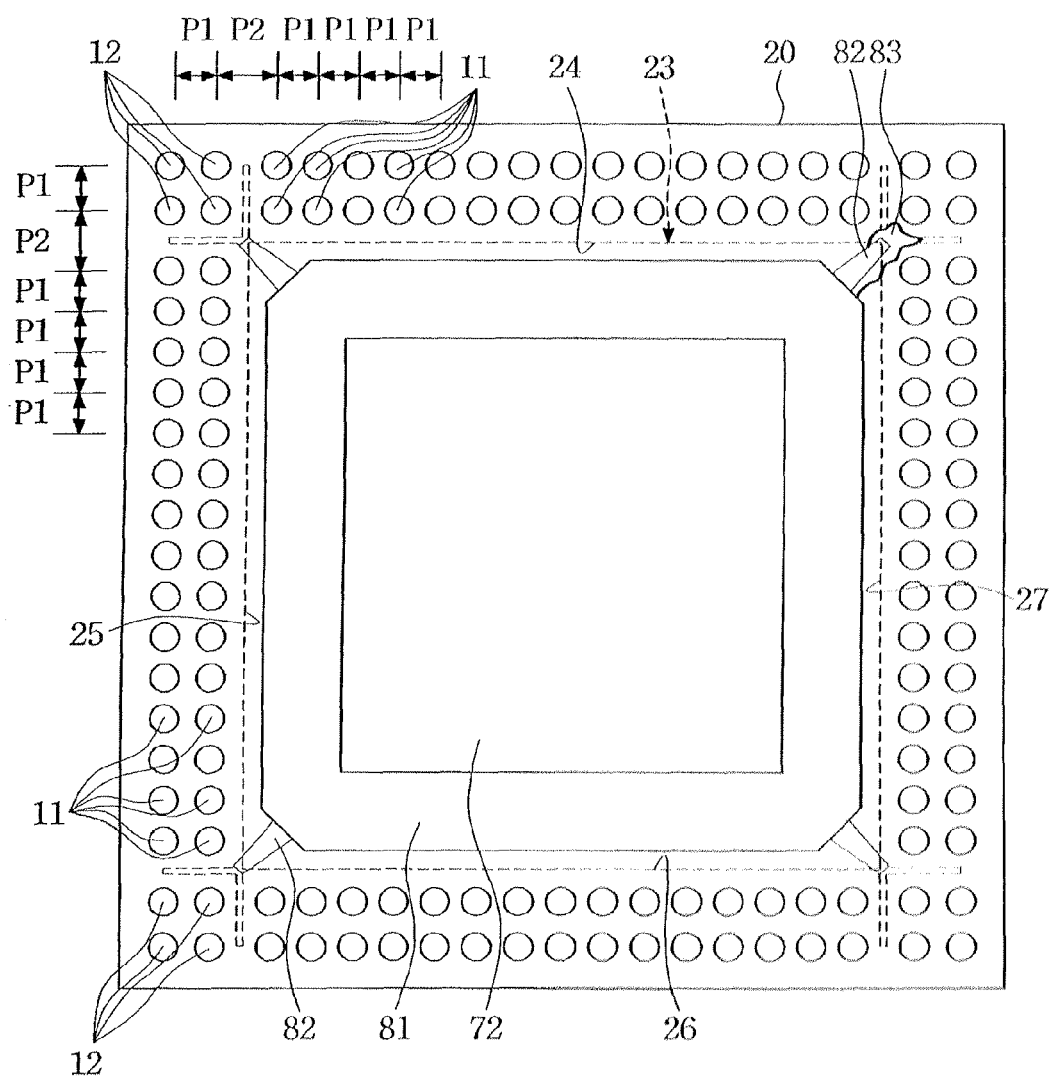
FIG. 2 illustrates a plan view of a semiconductor device according to example embodiments of the present general inventive concept.

FIG. 2 illustrates a plan view of a semiconductor device according to example embodiments of the present general inventive concept.

Referring to FIG. 2, a semiconductor device according to example embodiments may include a PCB 20 and a semiconductor chip 72 mounted on the PCB 20. The differences from the example embodiments of the present general inventive concept illustrated in FIG. 1 will be described below with reference to FIG. 2.

The PCB 20 may include a chip region 23, first ball lands 11 and second ball lands 12. The chip region 23 may be provided on one surface of the PCB 20. The chip region 23 may be defined by first boundary 24, second boundary 25, third boundary 26 and fourth boundary 27.

The first ball lands 11 may be arranged parallel to the adjacent one of the first to fourth boundaries 24, 25, 26 and 27. For example, at least one of the first ball lands 11 may be arranged on a place adjacent to the first boundary 24 along two rows parallel to the first boundary 24 at predetermined (e.g., regular) intervals. At least one of the first ball lands 11 may be arranged on a place adjacent to the second boundary 25 along two columns parallel to the second boundary 25 at predetermined (e.g., regular) intervals. The first ball lands 11 may be arranged to have a first pitch P1.

The second ball lands 12 may be arranged at intersections of extension lines of the first to fourth boundaries 24, 25, 26 and 27. That is, the second ball lands 12 may be arranged adjacent to corners of the chip region 23. One of the first ball lands 11 which is nearest to the second ball lands 12, and one of the second ball lands 12 which is nearest to the first ball lands 11 may be arranged to have a second pitch P2. For example, the second pitch P2 may be greater than the first pitch P1, and may be up to twice as great as the first pitch P1.

An EMC 81 covering the chip region 13 and having at least one protrusion 82 may be provided. The protrusion 82 may be formed along an air vent of a mold die. The protrusion 82 may be formed adjacent to the intersections of the first to fourth boundaries 24, 25, 26 and 27. The protrusion 82 may be formed between the second ball lands 12 and the first ball lands 11. The protrusion 82 may be arranged at a center between the second ball lands 12 and the first ball lands 11. A mold flash 83 may be formed around the protrusion 82. The mold flash 83 may be formed between the second ball lands 12 and the first ball lands 11.

Figure 3:
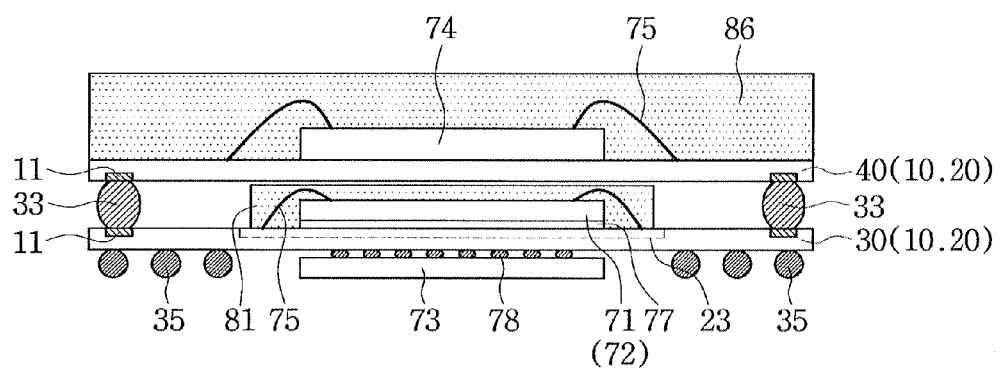
FIG. 3 illustrates a cross-sectional view of a semiconductor device according to example embodiments of the present general inventive concept.

FIG. 3 illustrates a cross-sectional view of a semiconductor device according to example embodiments of the present general inventive concept.

Referring to FIG. 3, a semiconductor device according to the example embodiments of the present general inventive concept may include a first PCB 30 and a second PCB 40. A first semiconductor chip 71 and a second semiconductor chip 73 may be mounted on the first PCB 30, and a third semiconductor chip 74 may be mounted on the second PCB 40. Conductive patterns 33 may be provided between the first PCB 30 and the second PCB 40. The conductive patterns 33 may be formed of one selected from the group consisting of a solder ball, a conductive bump, a conductive spacer and a combination thereof. The conductive bump may be a gold bump or a solder bump, or any other suitable bump to carry out the exemplary embodiments of the present general inventive concept as disclosed herein.

One surface of the first PCB 30 may include first ball lands 11, and second ball lands (not illustrated), which are similar to and/or the same as those described with reference to PCB 10 of FIG. 1 and PCB 20 of FIG. 2, and a chip region 23. The first semiconductor chip 71 may be mounted on the chip region 23 of the first PCB 30 using an adhesive 77. The first semiconductor chip 71 may be similar to and/or the same as the semiconductor chip 71 of FIG. 1 or the semiconductor chip 72 of FIG. 2. While the first semiconductor chip 71 may include a plurality of passive and/or active devices such as bonding pads, interconnections and/or transistors, the descriptions thereof will be omitted for simplicity.

The first semiconductor chip 71 may be electrically connected to internal interconnections (not illustrated) of the first PCB 30 through the connection interconnections 75. The connection interconnections 75 may be formed of an Au wire, an Al wire, a beam lead, a conductive tape, or a combination thereof to carry out the exemplary embodiments of the present general inventive concept as disclosed herein. The first ball lands 11 and the second ball lands (e.g., second ball lands 12, as illustrated in FIGS. 1 and 2) may include a Cu layer, a W layer, a WN layer, a Ti layer, a TiN layer, a Ta layer, a TaN layer, an Au layer, an Al layer, an Ag layer, a Pt layer, a Pd layer, a Sn layer, or a combination thereof to carry out the exemplary embodiments of the present general inventive concept as disclosed herein. Accordingly, the semiconductor chip 71 may be electrically connected to the first ball lands 11 and the second ball lands (e.g., second ball lands 12, as illustrated in FIGS. 1 and 2) through the connection interconnections 75 and the internal interconnections.

An EMC 81 covering at least a portion of the first semiconductor chip 71 and the connection interconnections 75 may be provided. The EMC 81 may protect the semiconductor chip 71 and the connection interconnections 75 from chemical and/or physical damage. That is, the EMC 81 may minimize chemical and/or physical damage to the semiconductor chip 71 and the connection interconnections 75.

The second semiconductor chip 73 may be mounted on the other surface of the first PCB 30. For example, the second semiconductor chip 73 may be mounted using a flip-chip technique. The second semiconductor chip 73 may be attached to the first PCB 30 using a solder ball 78. The second semiconductor chip 73 may be attached to the first PCB 30 using a conductive bump. The conductive bump may be a gold bump or a solder bump. While a protection layer such as an under fill (not illustrated) may be formed between the second semiconductor chip 73 and the first PCB 30, the description thereof will be omitted for simplicity.

External terminals 35 may be formed on the first PCB 30. The external terminals 35 may be formed adjacent to the second semiconductor chip 73. The external terminals 35 may be formed of one selected from the group consisting of a solder ball, a conductive bump, a conductive spacer, and a combination thereof. The conductive bump may be a gold bump, or a solder bump, or any suitable conductive bump to carry out the exemplary embodiments of the present general inventive concept disclosed herein. The second semiconductor chip 73 may be electrically connected to the external terminals 35 via the solder ball 78 and the internal interconnections (not illustrated). The first semiconductor chip 71 may be electrically connected to the external terminals 35 via the connection interconnections 75, the internal interconnections, the first ball lands 11 and the second ball lands (e.g., the second ball lands 12 as illustrated in FIGS. 1-2).

One surface of the second PCB 40 may include first ball lands 11 and second ball lands (e.g., the second ball lands 12 as illustrated in FIGS. 1-2), which are similar to those described with reference to PCB 10 of FIG. 1 and PCB 20 of FIG. 2. The third semiconductor chip 74 may be mounted on the other surface of the second PCB 40. The third semiconductor chip 74 may be electrically connected to the first ball lands 11 and the second ball lands of the second PCB 40 through the connection interconnections 75 and the internal interconnections (not illustrated). An EMC 86 at least partially covering the third semiconductor chip 74 and the connection interconnections 75 may be provided.

Conductive patterns 33 may be provided between the first PCB 30 and the second PCB 40. The conductive patterns 33 may electrically connect the first PCB 30 to the second PCB 40. The conductive patterns 33 may be in contact with the first ball lands 11 and the second ball lands (e.g., the second ball lands 12 as illustrated in FIGS. 1-2) of the second PCB 40. That is, the conductive patterns 33 may be in contact with the first ball lands 11 and the second ball lands 12 directly and physically.

The first PCB 30, the first semiconductor chip 71, and the second semiconductor chip 73 may be a lower package. The second PCB 40 and the third semiconductor chip 74 may be an upper package. The conductive patterns 33 may electrically connect the lower package to the upper package. That is, the third semiconductor chip 74 may be electrically connected to the external terminals 35 via the connection interconnections 75, the internal interconnections, the first ball lands 11, the second ball lands (e.g., the second ball lands 12 illustrated in FIGS. 1-2) and the conductive patterns 33. The semiconductor device according to the example embodiments of the present general inventive concept may be identified as a package-on-package (POP) type of semiconductor package.

Figure 4:
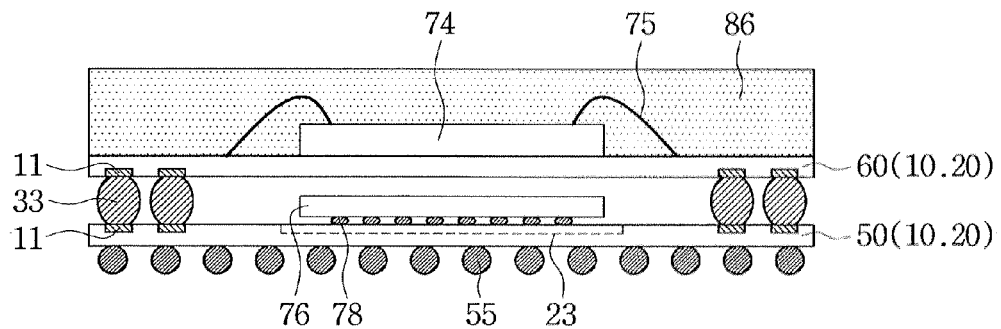
FIG. 4 illustrates a cross-sectional view of a semiconductor device according to example embodiments of the present general inventive concept.

FIG. 4 illustrates a cross-sectional view of a semiconductor device according to example embodiments of the present general inventive concept.

Referring to FIG. 4, a semiconductor device according to example embodiments of the present general inventive concept may include a first PCB 50, and a second PCB 60. A first semiconductor chip 76 may be mounted on the first PCB 50, and a second semiconductor chip 74 may be mounted on the second PCB 60. The second semiconductor chip 74 may be similar to the semiconductor chip 74 of FIG. 3. Conductive patterns 33 may be provided between the first PCB 50 and the second PCB 60. The conductive patterns 33 may be one selected from the group consisting of a solder ball, a conductive bump, a conductive spacer and a combination thereof.

The conductive bump may be a gold bump, or a solder bump, or any suitable conductive bump to carry out the exemplary embodiments of the present general inventive concept disclosed herein.

One surface of the first PCB 50 may include first ball lands 11, and second ball lands (e.g., second ball lands 12 as illustrated in FIGS. 1-2), which are similar to those described with reference to PCB 10 of FIG. 1 and PCB 20 of FIG. 2, and a chip region 23. The first semiconductor chip 76 may be mounted on the chip region 23 of the first PCB 50 using a flip-chip technique. The first semiconductor chip 76 may be attached to the first PCB 50 using a solder ball 78. Likewise, the first semiconductor chip 76 may be attached to the first PCB 50 using a conductive bump. The conductive bump may be a gold bump or a solder bump, or any suitable conductive bump to carry out the exemplary embodiments of the present general inventive concept disclosed herein. While a protection layer such as an under fill (not illustrated) may be formed between the first semiconductor chip 76 and the first PCB 50, the description thereof will be omitted for simplicity. While the first semiconductor chip 76 may include a plurality of passive and/or active devices such as bonding pads, interconnections, and/or transistors, the descriptions thereof will be omitted for simplicity.

The first semiconductor chip 76 may be electrically connected to internal interconnections (not illustrated) of the first PCB 50 through the solder ball 78. The first semiconductor chip 76 may be electrically connected to the first ball lands 11 and the second ball lands (e.g., the second ball lands 12 illustrated in FIGS. 1-2) through the internal interconnections.

External terminals 55 may be formed on the other surface of the first PCB 50. The external terminals 55 may be formed of one selected from the group consisting of a solder ball, a conductive bump, a conductive spacer, and a combination thereof. The conductive bump may be a gold bump or a solder bump, or any suitable conductive bump to carry out the exemplary embodiments of the present general inventive concept disclosed herein. The first semiconductor chip 76 may be electrically connected to the external terminals 55 via the solder ball 78 and the internal interconnections (not illustrated).

One surface of the second PCB 60 may include first ball lands 11, and second ball lands (not illustrated), which are the same as and/or similar to those described with reference to PCB 10 of FIG. 1 and PCB 20 of FIG. 2. The second semiconductor chip 74 may be mounted on the other surface of the second PCB 60. The second semiconductor chip 74 may be electrically connected to the first ball lands 11 and the second ball lands of the second PCB 60 through connection interconnections 75 and internal interconnections (not illustrated). An EMC 86 at least partially covering the second semiconductor chip 74 and the connection interconnections 75 may be provided.

Conductive patterns 33 may be provided between the first PCB 50 and the second PCB 60. The conductive patterns 33 may electrically connect the first PCB 50 to the second PCB 60. The conductive patterns 33 may be in contact with the first PCB 50 and the first ball lands 11 and the second ball lands (e.g., the second ball lands 12 illustrated in FIGS. 1-2) of the second PCB 60 directly and physically. The first PCB 50 and the first semiconductor chip 76 may be at least part of a lower package. The second PCB 60 and the second semiconductor chip 74 may be at least part of an upper package. The conductive patterns 33 may electrically connect the lower package to the upper package. That is, the second semiconductor chip 74 may be electrically connected to the external terminals 55 via the connection interconnections 75, the internal interconnections, the first ball lands 11, the second ball lands (e.g., the second ball lands 12 illustrated in FIGS. 1-2), and the conductive patterns 33. The semiconductor device according to the example embodiments illustrated in FIG. 4 may be identified as a POP type of semiconductor package.

Figure 5:
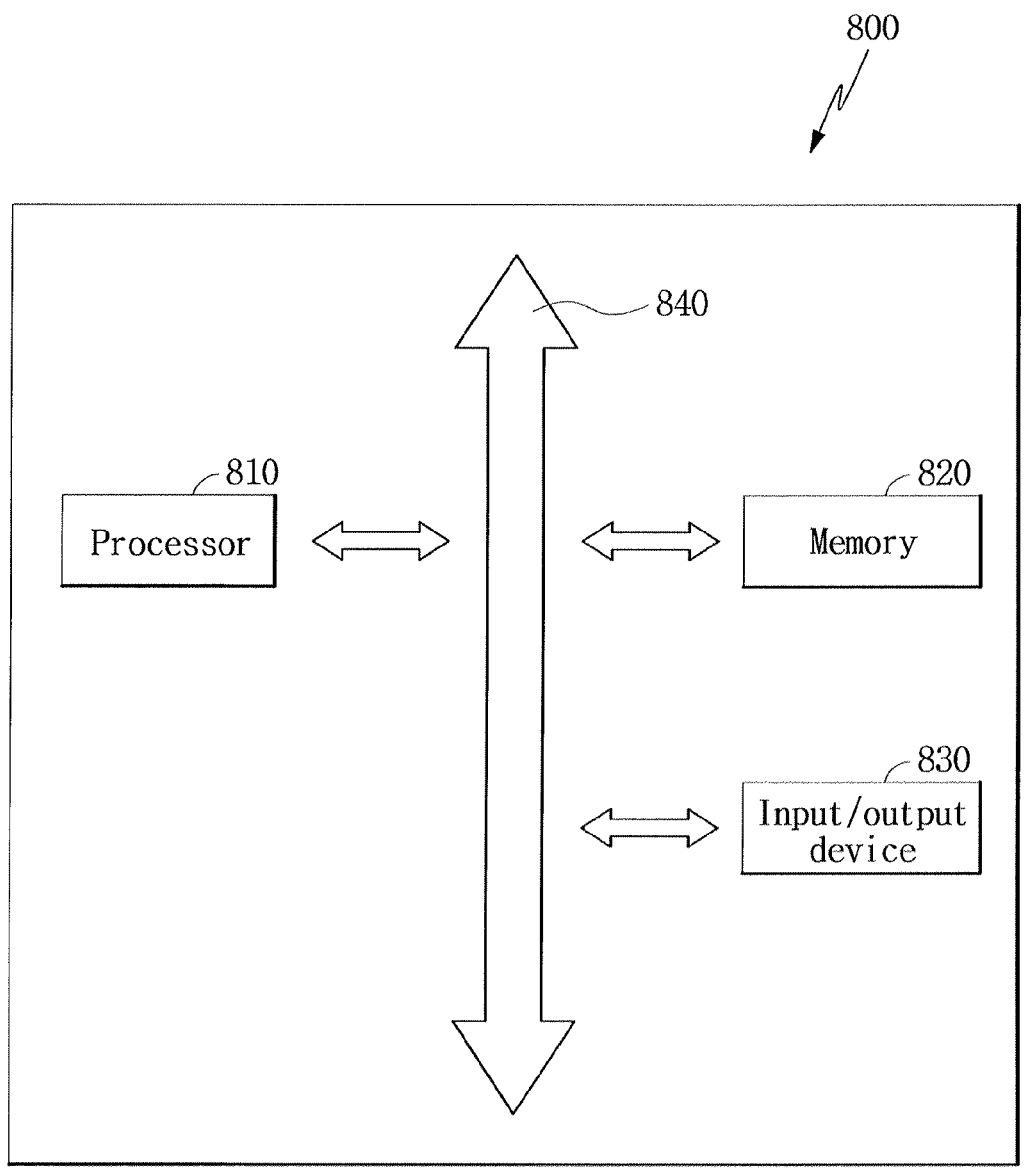
FIG. 5 is a schematic block diagram illustrating an electronic system according to example embodiments of the present general inventive concept.

FIG. 5 illustrates a block diagram of an electronic system according to example embodiments of the present general inventive concept.

Referring to FIG. 5, an electronic system 800 may include a memory 820, and a microprocessor 810 electrically connected to the memory 820. Here, the memory 820 and/or the microprocessor 810 may be a semiconductor device described with reference to FIGS. 1 to 4. Microprocessor 810 may be any suitable processor, programmable logic device (PLD), application specific integrated circuit (ASIC), field programmable gate array (FPGA), and/or controller to carry out the exemplary embodiments of the present general inventive concept disclosed herein.

The electronic system 800 may correspond to a part of a laptop computer, a digital camera, a cellular phone, a smart phone, a personal digital assistant, and/or a tablet computer. The microprocessor 810 and the memory 820 may be installed on a mainboard, and the memory 820 may be a data storage media that may be controller by the microprocessor 810. The plurality of memories 820 and/or the plurality of microprocessors 810 may be mounted on the mainboard of the electronic system 800.

The electronic system 800 may exchange data with other electronic systems such as personal computers and/or computer networks through an input/output device 830. The input/output device 830 may provide data to a peripheral bus line of a computer, a high-speed transmission line or a wireless transmission/reception antenna. The data communications between the microprocessor 810 and the input/output device 830 in addition to those between the microprocessor 810 and the memory 820 may be accomplished using bus architectures 840. The input/output device 830 may be communicatively coupled to a wired and/or wireless communication network, and one or more electronic devices may be communicatively coupled to the communication network. That is, the input/output device 830 may exchange data with one or more electronic systems via the wired and/or wireless communication network.

In example embodiments of the present general inventive concept, the electronic system 800 may be implemented as a semiconductor package as illustrated in FIG. 3 or 4. For example, at least one f the first to third semiconductor chips 71, 73 and 74 of FIG. 3 may correspond to the memory 820, and at least one of the other first to third semiconductor chips 71, 73 and 74 may correspond to the microprocessor 810 and/or the input/output device 830.

Example embodiments may be applied to one or more devices such as a package module, a card system, and/or a solid state disk (SSD).

According to example embodiments of the present general inventive concept, a plurality of first ball lands (e.g., first ball lands 11 illustrated in FIGS. 1-2) having a first pitch (e.g., first pitch P1) are provided. The first pitch may be a standard pitch. Also, at least one second ball land (e.g., second ball lands 12 illustrated in FIGS. 1-2) adjacent to the first ball lands is provided. One of the first ball lands which is nearest to the second ball land, and the second ball land have a second pitch (e.g., second pitch P2). The second pitch may be greater than the first pitch, and may be up to twice as great as the first pitch. Accordingly, a distance between the second ball land and the first ball lands has an alterable margin. That is, the size of a printed circuit board may be adjustable in response to the plurality of sizes of semiconductor chips. A reduce package size having similar performance to a reduced sized version of the semiconductor chip but with a smaller size can be easily implemented.

A distance between the second ball land and the first ball lands can be increased compared to the conventional art. An invasion failure of a mold flash onto the first ball lands or the second ball land may be mitigated and/or minimized.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor device, comprising:
   a first printed circuit board including a chip region, a plurality of first ball lands adjacent to the chip region, and at least one second ball land adjacent to the first ball lands; and
   a first semiconductor chip mounted on the chip region,
   wherein the plurality of first ball lands are arranged to have a first pitch, and one of the plurality of first ball lands which is nearest to the second ball land and the second ball land have a second pitch greater than the first pitch, and
   wherein the chip region includes first, second, third, and fourth boundaries, the first boundary is parallel to the third boundary, the second boundary is parallel to the fourth boundary, the plurality of first ball lands are arranged parallel to the adjacent one of the first to fourth boundaries, and the second ball land is arranged adjacent to intersections of the first to fourth boundaries.

2. The device of claim 1, wherein the second pitch is up to twice as great as the first pitch.

3. The device of claim 1, wherein the first ball lands are arranged in a straight line, and the second ball land is arranged on an extension line of the straight line.

4. The device of claim 1, further comprising:
   an epoxy molding compound (EMC) covering the chip region and having at least one protrusion,
   wherein the protrusion is formed between the second ball land and the first ball lands.

5. The device of claim 4, wherein the protrusion is arranged at the center between the second ball land and the first ball lands.

6. The device of claim 5, further comprising:
   a mold flash formed around the protrusion.

7. The device of claim 1, further comprising:
   a second semiconductor chip provided on the first printed circuit board; and
   conductive patterns formed between the second semiconductor chip and the first and second ball lands,
   wherein the second semiconductor chip is electrically connected to the first and second ball lands via the conductive patterns.

8. The device of claim 7, further comprising:
   a second printed circuit board provided between the second semiconductor chip and the conductive patterns, wherein the second printed circuit board includes other ball lands corresponding to the first and second ball lands.

9. The device of claim 7, wherein the conductive patterns are formed of one selected from the group consisting of a solder ball, a conductive bump, a conductive spacer and a combination thereof.

10. A printed circuit board (PCB), comprising:
    a chip region;
    a plurality of first ball lands adjacent to the chip region; and
    at least one second ball land adjacent to the first ball lands,
    wherein the plurality of first ball lands are arranged to have a first pitch, and one of the plurality of first ball lands which is nearest to the second ball land and the second ball land have a second pitch greater than the first pitch, which is up to twice as great as the first pitch, and
    wherein the chip region includes first, second, third and fourth boundaries, wherein the first boundary is parallel to the third boundary, the second boundary is parallel to the fourth boundary, the first ball lands are arranged parallel to the adjacent one of the first to fourth boundaries, and the second ball land is arranged adjacent to intersections of the first to fourth boundaries.

11. The PCB of claim 10, wherein the first ball lands are arranged in a straight line, and the second ball land is arranged on an extension line of the straight line.

12. An electronic system, comprising:
    a mainboard;
    an input/output device formed on the mainboard; and
    at least one semiconductor package formed on the mainboard and electrically connected to the input/output device,
    wherein the semiconductor package comprises:
        a printed circuit board having a first chip region, a plurality of first ball lands adjacent to the chip region, and at least one second ball land adjacent to the first ball lands; and
        a first semiconductor chip mounted on the first chip region, wherein the plurality of first ball lands are arranged to have a first pitch, and one of the first ball lands which is nearest to the second ball land, and the second ball land have a second pitch which is greater than the first pitch and up to twice as great as the first pitch or smaller,
        wherein the chip region has first, second, third and fourth boundaries, wherein the first and third boundaries are parallel to each other, the second and fourth boundaries are parallel to each other, the first ball lands are arranged parallel to the adjacent one of the first to fourth boundaries, and the second ball land is arranged adjacent to intersections of the first to fourth boundaries.

13. The system of claim 12, wherein the first ball lands are arranged in a straight line, and the second ball land is arranged on an extension line of the straight line.

14. The system of claim 12, further comprising:
    a second semiconductor chip provided on the printed circuit board; and
    conductive patterns formed between the second semiconductor chip and the first and second ball lands, wherein the second semiconductor chip is electrically connected to the first and second ball lands via the conductive patterns.

15. A semiconductor package, comprising:
    a first printed circuit board including a chip region to mount a semiconductor chip defined by at least a first boundary and a second boundary, a plurality of first ball lands disposed outside the chip region, and at least one second ball land disposed adjacent to the intersection of the first boundary and the second boundary, wherein the plurality of first ball lands are arranged to have a first pitch, and wherein the second ball land and one of the plurality of first ball lands which is nearest to the second ball land have a second pitch that is greater than the first pitch.

16. The semiconductor package of claim 15, wherein the chip region is further defined by a third boundary and a fourth boundary, with the first and third boundaries parallel with one another, and the second and fourth boundaries parallel with one another.

17. The semiconductor package of claim 16, wherein the plurality of the first ball lands are arranged parallel to at least one of the first, second, third, and fourth boundaries outside the chip region.

18. The semiconductor package of claim 16, wherein at least another second ball land is disposed adjacent to at least one of the intersection of the second and third boundaries, the third and fourth boundaries, and the first and fourth boundaries.

19. The semiconductor package of claim 15, further comprising:
an epoxy molding compound (EMC) covering at least a portion of the chip region and having at least one protrusion,
wherein the protrusion is formed between the second ball land and the first ball lands.

20. The semiconductor package of claim 19, wherein the protrusion is arranged between the second ball land and the first ball lands.

21. The semiconductor package of claim 20, further comprising:
a mold flash formed around at least a portion of the protrusion.

22. The semiconductor package of claim 15, further comprising:
a second chip region provided on the first printed circuit board; and
conductive patterns formed between the second chip region and the first and second ball lands,
wherein the second chip region is electrically connected to the first and second ball lands via the conductive patterns.

23. The semiconductor package of claim 22, further comprising:
a second printed circuit board provided between the second chip region and the conductive patterns, wherein the second printed circuit board includes other ball lands corresponding to the first and second ball lands.

24. An electronic system, comprising:
a mainboard;
an interface formed on the mainboard to transmit and receive signals; and
at least one semiconductor package formed on the mainboard and electrically connected to the interface,
wherein the semiconductor package comprises:
a first printed circuit board including a chip region to mount a semiconductor chip defined by at least a first boundary and a second boundary, a plurality of first ball lands disposed outside the chip region, and at least one second ball land disposed adjacent to the intersection of the first boundary and the second boundary,
wherein the plurality of first ball lands are arranged to have a first pitch, and
wherein the second ball land and one of the plurality of first ball lands which is nearest to the second ball land have a second pitch that is greater than the first pitch.

25. The electronic system of claim 24, wherein the chip region is further defined by a third boundary and a fourth boundary, with the first and third boundaries parallel with one another, and the second and fourth boundaries parallel with one another.

26. The electronic system of claim 25, wherein the plurality of the first ball lands are arranged parallel to at least one of the first, second, third, and fourth boundaries outside the chip region.

27. The electronic system of claim 25, wherein at least another second ball land is disposed adjacent to at least one of the intersection of the second and third boundaries, the third and fourth boundaries, and the first and fourth boundaries.

* * * * *